(12) United States Patent
Motobayashi et al.

(10) Patent No.: US 8,077,886 B2
(45) Date of Patent: Dec. 13, 2011

(54) DIGITAL MICROPHONE

(75) Inventors: Tetsuya Motobayashi, Machida (JP);
Koichi Maezawa, Toyama (JP)

(73) Assignees: Kabushiki Kaisha Audio-Technica,
Tokyo (JP); **National University
Corporation University of Toyama**,
Toyama (JP)

( * ) Notice: Subject to any disclaimer, the term of this patent is extended or adjusted under 35 U.S.C. 154(b) by 456 days.

(21) Appl. No.: 12/401,015

(22) Filed: Mar. 10, 2009

(65) Prior Publication Data
US 2009/0232339 A1  Sep. 17, 2009

(30) Foreign Application Priority Data
Mar. 11, 2008  (JP) .................................. 2008-060529

(51) Int. Cl.
*H01R 25/00*  (2006.01)
(52) U.S. Cl. .......................... 381/174; 381/179; 381/369
(58) Field of Classification Search ........................ None
See application file for complete search history.

(56) References Cited

U.S. PATENT DOCUMENTS
2004/0156520 A1* 8/2004 Poulsen et al. ................ 381/369
2009/0022341 A1* 1/2009 Shams et al. .................. 381/174

FOREIGN PATENT DOCUMENTS
JP  2005-519547 A  6/2005

OTHER PUBLICATIONS

Mats Hovin, et al., "Delta-Sigma Modulators Using Frequency-Modulated Intermediate Values", Jan. 1, 1997, IEEE Journal of Solid-State Circuits, vol. 32, No. 1, pp. 13-22.
Dag T. Wisland, et al., "A Novel Multi-Bit Parallel ΔΣ FM-to-Digital Converter with 24-bit Resolution", 2002, ESSCIRC 2002, pp. 687-690.

* cited by examiner

*Primary Examiner* — Alonzo Chambliss
(74) *Attorney, Agent, or Firm* — Sughrue Mion, PLLC

(57) ABSTRACT

A digital microphone comprises a ΔΣ modulator. The ΔΣ modulator has a resonator including a membrane which vibrates by receiving a sound wave and a wiring pattern disposed opposite to the membrane, an oscillator, including the resonator, for outputting an FM signal according to the vibration of the membrane, and a one-bit quantizer for outputting a one-bit quantized signal by sampling the FM signal with a high-frequency clock.

9 Claims, 5 Drawing Sheets

RELATED ART

RELATED ART

DIGITAL MICROPHONE

BACKGROUND OF THE INVENTION

1. Field of the Invention

The present invention relates to a digital microphone in which a digital signal output can be directly obtained by a method completely different from that used in conventional digital microphones, and which is preferably used for professional use.

2. Description of the Related Art

A professional-use audio microphone should fulfill a broad frequency band equal to or broader than 100 KHz, and extremely wide dynamic range of 140 dB. These required specifications are difficult to be achieved with the current digital technology. The present invention relates to a digital microphone whereby the above-mentioned required specifications can be achieved with a unique idea. Before proceeding to a description of the present invention, the conventional related arts will now be described.

A conventional digital output microphone mainly comprises a microphone unit, a preamplifier, and an analog/digital converter (hereinafter referred to as "AD converter"). The microphone unit performs electroacoustic conversion after receiving a sound wave, and output an audio signal as an analog signal. The output audio signal, after being amplified by the preamplifier, is converted into a digital signal by the AD converter, and then is output as a microphone output.

FIG. 4 shows an exemplary conventional digital output microphone. Referring to FIG. 4, a microphone 80 is, for example, a condenser microphone. When a diaphragm (hereinafter referred to as "membrane") of the condenser microphone vibrates by receiving a sound wave, the capacitance between the membrane and a fixed electrode opposite to the membrane is changed. The change in the capacitance causes a voltage change which is then amplified by a preamplifier 82 and is impedance-conversed, and is input to an AD converter to be converted into a digital signal. In this conventional digital microphone, the AD converter comprises a delta-sigma (hereinafter referred to as "$\Delta\Sigma$") modulator 84 functioning in synchronization with a high-frequency clock and is converting an analog input signal into a one-bit density modulated digital signal, and a digital filter 86 functioning in synchronization with a low-frequency clock.

The above-mentioned $\Delta\Sigma$ modulator 84 is a core of the AD converter, and as shown in FIG. 5, comprises an integrator 842, a one-bit quantizer 843 embodied by a comparator or the like, and a digital/analog converter (hereinafter referred to as "DA converter") 845. The DA converter 845 serves as a unit for providing a negative-feedback of an output from the one-bit quantizer 843. In the $\Delta\Sigma$ modulator 84 configured as mentioned above, an input analog signal is sampled at an extremely higher frequency than the audio signal band (i.e., oversampling), and is converted into a one-bit pulse density modulated digital signal. As a result, the noise shaping effect can be brought about in which quantization noises are moved to the high-frequency side.

A digital microphone with use of a $\Delta\Sigma$ modulator has been already known. Examples thereof include a digital microphone disclosed in Patent Document 1. Patent Document 1 discloses a digital microphone comprising a transducer for generating an acoustic signal of an analog signal corresponding to a sound wave, and a single bit $\Delta\Sigma$ modulator AD converter for generating a digital output signal from the analog signal in the form of a $\Delta\Sigma$ modulated bit stream at an oversampled rate. The digital microphone of Patent Document 1 is basically identical to the conventional digital microphone as shown in FIGS. 4 and 5.

[Patent Document 1] Published Japanese Translation of PCT International Publication for Patent Application No. 2005-519547

SUMMARY OF THE INVENTION

The AD converter with use of the $\Delta\Sigma$ modulator shown in FIG. 5 is available in the form of an IC, and conventional digital microphones such as the one disclosed in Patent Document 1 employ the AD converter in the form of an IC, which is incorporated in the body of the microphone. Therefore, an analog signal is output from the microphone unit serving as an electroacoustic converter, and is input to the AD converter with use of the $\Delta\Sigma$ modulator through an amplifier circuit, a buffer circuit, a differential circuit and the like. The signal is processed in the analog domain until then, and is processed in the digital domain after being converted at the AD converter. Therefore, noises generated at the above-mentioned amplifier circuit, buffer circuit, differential circuit and the like are added to the analog signal, whereby it is difficult to provide a digital microphone with sufficiently satisfactory low noise and wide dynamic range for professional use.

An object of the present invention is to provide a digital microphone that enables a microphone unit to directly output an audio signal as a digital signal, thereby eliminating the needs for an amplifier circuit, a buffer circuit, a differential circuit and the like, so as to realize a digital microphone with sufficiently satisfactory low noise and wide dynamic range for professional use.

One aspect of the present invention is a digital microphone comprising a $\Delta\Sigma$ modulator, for outputting a digital signal, wherein the $\Delta\Sigma$ modulator has a resonator including a membrane which vibrates by receiving a sound wave, and a wiring pattern disposed opposite to the membrane, an oscillator, including the resonator, for outputting an FM signal according to the vibration of the membrane, and a one-bit quantizer for outputting a one-bit quantized signal by sampling the FM signal with a high-frequency clock.

Another aspect of the present invention is a digital microphone comprising a $\Delta\Sigma$ modulator, wherein the $\Delta\Sigma$ modulator has a condenser constituted by a membrane which vibrates by receiving a sound wave, and an opposed electrode disposed opposite to the membrane, a resonator constituted by the condenser and an inductor connected to the condenser, an oscillator, including the resonator, for outputting an FM signal according to the vibration of the membrane, and a one-bit quantizer for outputting a one-bit quantized signal by sampling the FM signal with a high-frequency clock.

When the membrane vibrates by receiving a sound wave, an electrical condition between the membrane and the resonator, such as a capacitance or an inductance, is changed. According to this change in the electrical condition, the resonance frequency of the resonator is changed, and the oscillation frequency of the oscillator is changed. That is, the oscillator outputs an FM signal according to the vibration of the membrane. This FM signal is quantized by the one-bit quantizer to be output as a digital signal.

In this way, an FM signal can be directly obtained in the electroacoustic conversion unit in the microphone, and the FM signal can be converted into a digital signal and be output as a digital signal by the one-bit quantizer in the microphone. Therefore, unlike conventional digital microphones, there is no need to convert an analog signal output from the microphone into a digital signal with use of an amplifier circuit, a buffer circuit, a differential circuit and the like. As a result, noises inevitably generated by use of the amplifier circuit, the buffer circuit, the differential circuit, and the like would be prevented and a digital microphone with sufficiently satisfactory low noise and wide dynamic range for professional use can be obtained.

In an embodiment in which the ΔΣ modulator comprises a condenser constituted by a membrane adapted to vibrate by receiving a sound wave and an opposed electrode disposed opposite to the membrane, a resonator constituted by the condenser and an inductor connected to the condenser, an oscillator, including the resonator, for outputting an FM signal according to the vibration of the membrane, and a one-bit quantizer for outputting a one-bit quantized signal by sampling the FM signal with a high-frequency clock, it is possible to provide a digital microphone capable of directly outputting a digital signal by utilizing a structure of a condenser microphone unit.

DESCRIPTION OF THE PREFERRED EMBODIMENTS

Hereinbelow, embodiments of a digital microphone according to the present invention will be described with reference to the drawings.

First Embodiment

Figure 1:
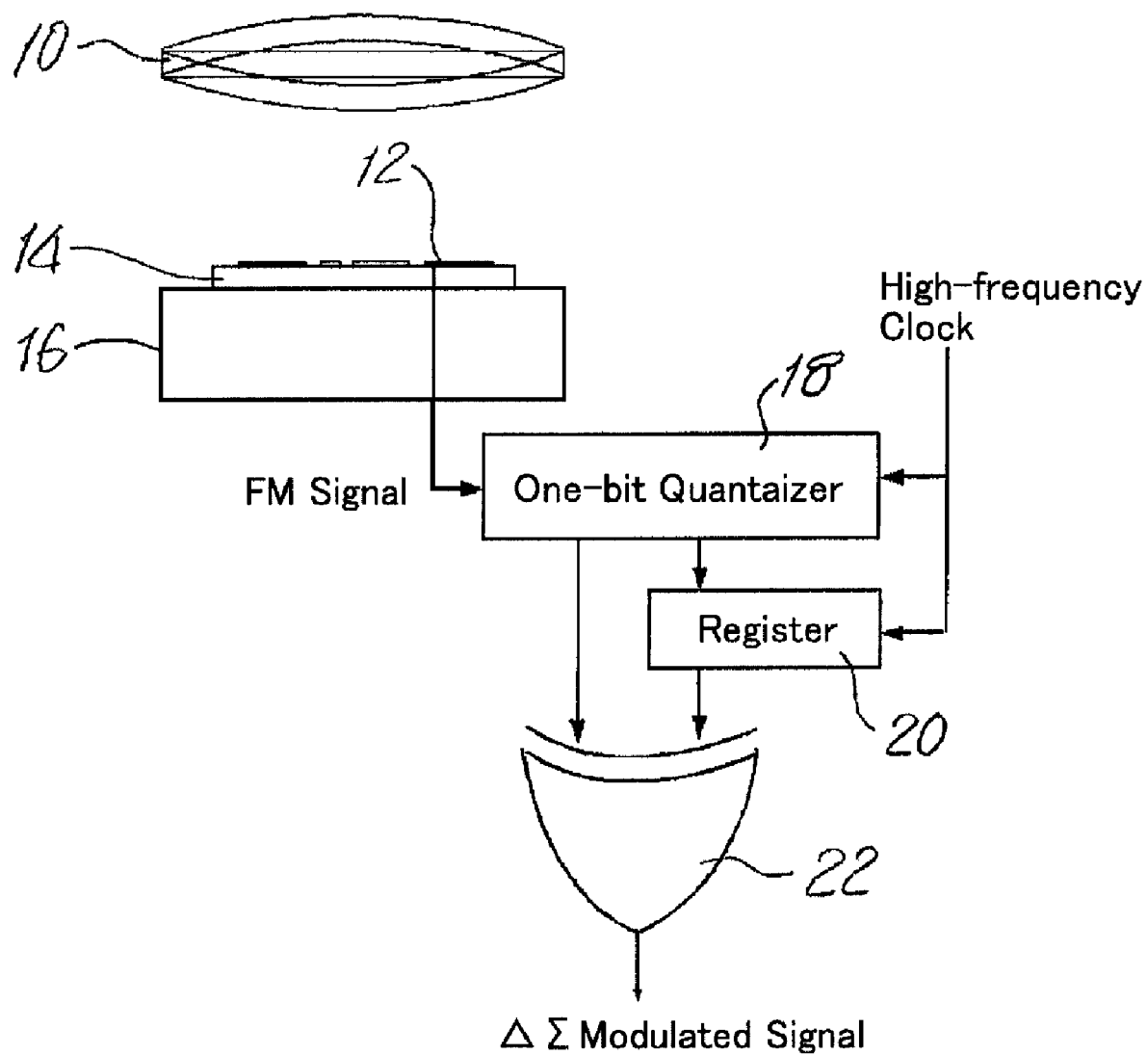
FIG. 1 is a conceptual diagram illustrating a first embodiment of a digital microphone according to the present invention.

In FIG. 1, reference numeral 10 denotes a membrane, which vibrates by receiving a sound wave. A resonator 12 is disposed on a substrate 14 so as to face the membrane 10. The substrate 14 is fixed on one side of a back plate 16. A wiring pattern is formed on the surface of the substrate 14 facing the membrane 10, and the resonator 12 includes this wiring pattern. When the membrane 10 vibrates by receiving a sound wave, the electromagnetic field between the membrane 10 and the resonator 12 is changed, which causes a change in the resonance frequency of the resonator 12. The resonator constitutes a part of an oscillator, and the oscillator is configured to output an FM signal according to the vibration of the membrane 10 and the change in the resonance frequency. The membrane 10, the oscillator including the resonator 12, the substrate 14, and the back plate 16 are incorporated in a not-shown unit case to form a microphone unit. The oscillator including the resonator 12 can be integrated on and incorporated into the substrate 14.

The change caused by the vibration of the membrane 10 in the electromagnetic field between the membrane 10 and the resonator 12 may be, for example, a change in a capacitance of a condenser, or a change in an inductance of a inductor. In an embodiment in which the above-mentioned change in the electromagnetic field is a change in a capacitance of a condenser, the membrane 10 and the wiring pattern respectively serve as the electrodes of the condenser, and the vibration of the membrane 10 causes a change in the capacitance of the above-mentioned condenser, which in turn causes a change in the resonance frequency of the resonator. On the other hand, in an embodiment in which the above-mentioned change in the electromagnetic field is embodied by a change in an inductance, for example, the wiring pattern forms a pattern operable as an inductor, and the vibration of the membrane 10 causes a change in the inductance of the above-mentioned inductor, which in turn causes a change in the resonance frequency of the resonator.

In other words, any configuration may be employed as long as a certain electromagnetic field distribution is formed between the membrane 10 and the wiring pattern so that a resonance condition is established and a resonator is realized. An LC resonator may be formed by arranging the wiring pattern such that the wiring pattern can serve as both of a capacitance C and an inductance L. It should be noted that the resonator in the present invention is not limited to the above-mentioned resonators using the capacitance C or/and the inductance L, and another type of resonator may be employed as long as a resonance condition is maintained.

Referring to FIG. 1, an FM signal output from the oscillator is input to a one-bit quantizer 18. The one-bit quantizer 18 samples the FM signal with a high-frequency clock, and outputs a one-bit quantized signal. The one-bit quantized signal is input to one of input terminals of an exclusive OR circuit 22, and is also input to the other of the input terminals of the exclusive OR circuit 22 through a register 20. The register 20 functions in synchronization with the high-frequency clock at the same frequency as the sampling frequency, and inputs the one-bit quantized signal to the exclusive OR circuit 22 at a different time. The register 20 and the exclusive OR circuit 22 constitute an edge detector for detecting an edge of the one-bit quantized signal output from the one-bit quantizer 18, and the output of the exclusive OR circuit 22 is a ΔΣ modulated signal. A digital signal consisting of a plurality of bits can be obtained by sending the ΔΣ modulated signal through a digital filter.

According to the above-described first embodiment, a change in the membrane is directly converted into a change in the oscillation frequency of the oscillator. That is, an acoustic signal can be directly converted into an FM signal. A ΔΣ modulated signal can be obtained by sampling the FM signal with the high-frequency clock to convert the FM signal into a one-bit quantized signal, and sending the one-bit quantized signal through the edge detector consisting of the register 20 and the exclusive OR circuit 22. It is possible to provide a digital microphone with high S/N ratio and wide dynamic range, by setting the frequency of the oscillator to a sufficiently high value such as 20 GHz, and also setting the sampling frequency to a comparably sufficiently high value.

The ΔΣ modulation method used in the first embodiment is called "ΔΣ modulation using FM intermediate signal (FMDSM)". A noticeable advantage of this method is that, in principle, any feedback error does not occur since a feedback circuit is not required, and the high resolution performance can be obtained just by setting a high sampling rate. Nevertheless, this advantage cannot be effectively utilized in the conventional arts since highly accurate linearity and large modulation width are required when an input signal is converted into an FM signal.

According to this embodiment of the present invention, an acoustic signal can be converted into a ΔΣ modulated signal with an extremely high degree of accuracy since a change in the membrane can be directly converted into a frequency modulated signal. The thus obtained ΔΣ modulated signal consists of one bit, but already takes the form of a digital signal, whereby the ΔΣ modulated signal can be subsequently converted into a multi-bit digital signal at Nyquist rate by, for example, a digital signal processor (DSP).

Second Embodiment

Figure 2:
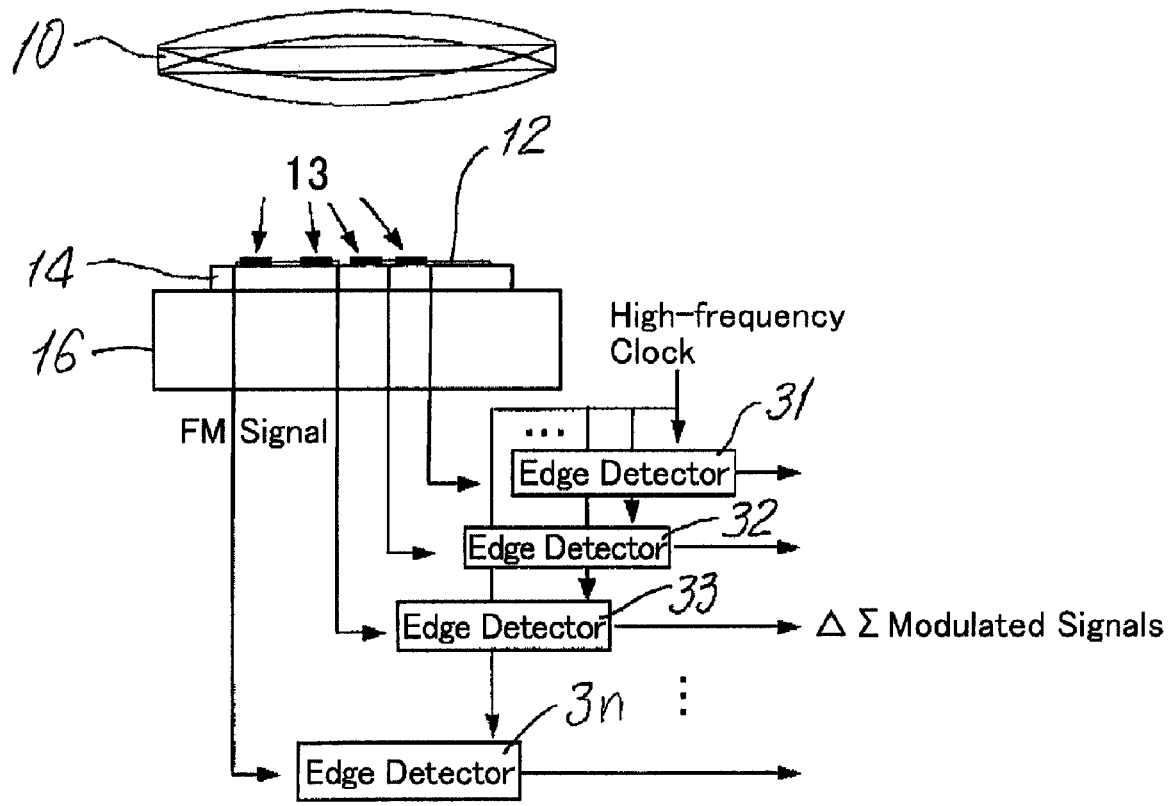
FIG. 2 is a conceptual diagram illustrating a second embodiment of a digital microphone according to the present invention.

Next, a second embodiment of the present invention shown in FIG. 2 will be described. In this embodiment, an oscillator can output a plurality of FM signals, which are then input to their corresponding edge detectors so that a number of parallel ΔΣ modulated signals, can be output. A membrane 10, the oscillator including a resonator 12, a substrate 14, and a back plate 16 in the second embodiment are configured similarly to those in the first embodiment, and a wiring pattern on the substrate 14 constitutes the resonator 12. The resonator 12 in the second embodiment may be a resonator of which resonance frequency change is caused by a capacitance C change, similarity to the one in the first embodiment, or may be embodied by a resonator of which resonance frequency change is caused by an inductance change. Alternatively, the resonator 12 may be embodied by any configuration in which a resonance condition is established and thereby a resonator is realized by formation of a certain electromagnetic distribution.

A plurality of variable delay circuits 13 are disposed on the substrate 14. The variable delay circuits 13 provide different delay times according to opposed positions to the membrane 10. In the oscillator, a resonance frequency signal is output by the resonator 12, and then a plurality of FM signals are output through the delay circuits 13. In the second embodiment, these FM signals are respectively sent through one-bit quantizers, and an edge detector 31, 32, 33, . . . and 3n, so that parallel ΔΣ modulated signals as many as n of the number of the FM signals and the edge detectors are output. In FIG. 2, the one-bit quantizers are included in the edge detectors.

The edge detectors 31, 32, 33, . . . 3n can be embodied by a circuit similar to the register 20 and the exclusive OR circuit 22 in the first embodiment, and are respectively configured to function according to a high-frequency clock.

In the above-discussed second embodiment, an FM signal is delayed by a plurality of the variable delay circuits 13 so that a plurality of the FM signals having different phases are created, and the edges of the created FM signals are detected so that parallel ΔΣ modulated signals are output.

If a plurality of FM signals are output at a fixed delay time, just the same effect is brought about as that of an embodiment in which a plurality of separate ΔΣ modulators are arranged. In such an embodiment, since the quantization noises of the ΔΣ modulators are noncorrelated with one another, the S/N ratio is improved by 3 dB with every doubling of the number of the parallelization.

On the other hand, in the digital microphone in the above-discussed second embodiment, the delay time is varied according to positions of the membrane, similarly to the oscillation frequency. Due to this arrangement, the respective quantization noises of the parallelized ΔΣ modulators are eliminated, and thereby the S/N ratio is advantageously improved by 6 dB with every doubling of the number of the parallelization.

Third Embodiment

Figure 3:
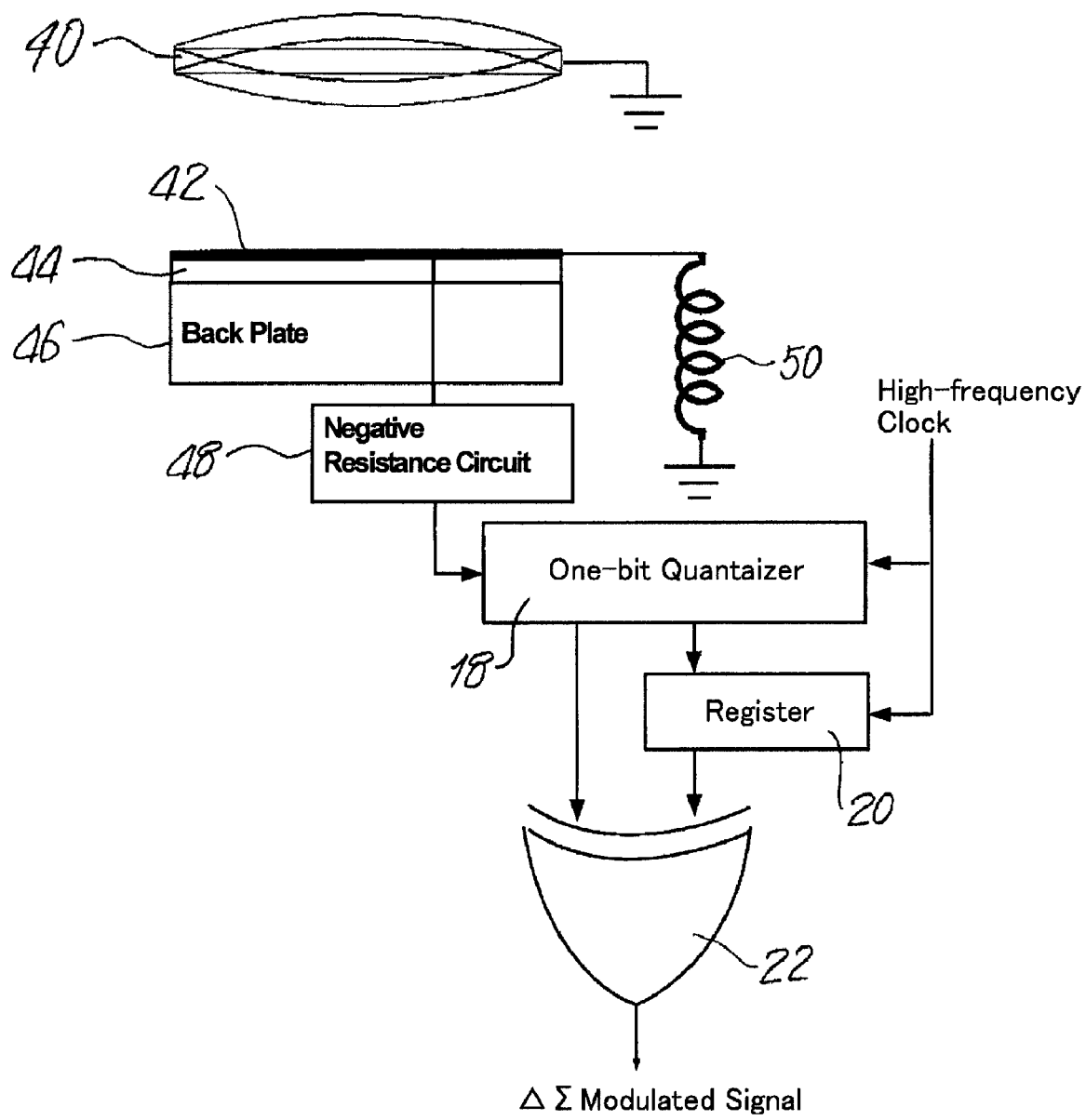
FIG. 3 is a conceptual diagram illustrating a third embodiment of a digital microphone according to the present invention.
Figure 4:
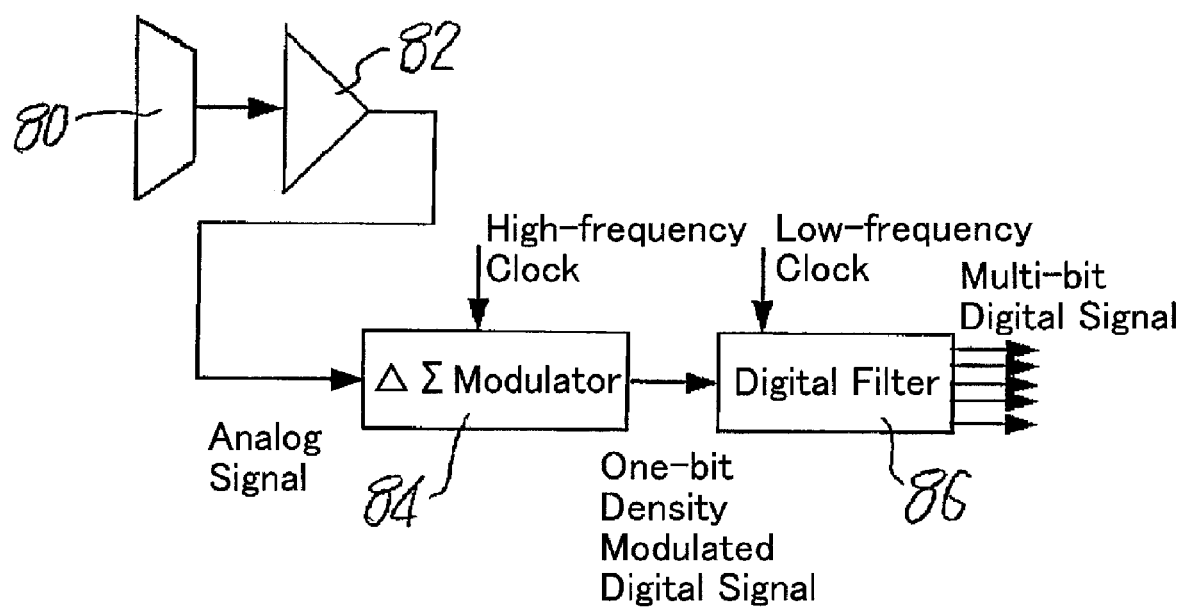
FIG. 4 is a block diagram illustrating an exemplary conventional digital microphone.
Figure 5:
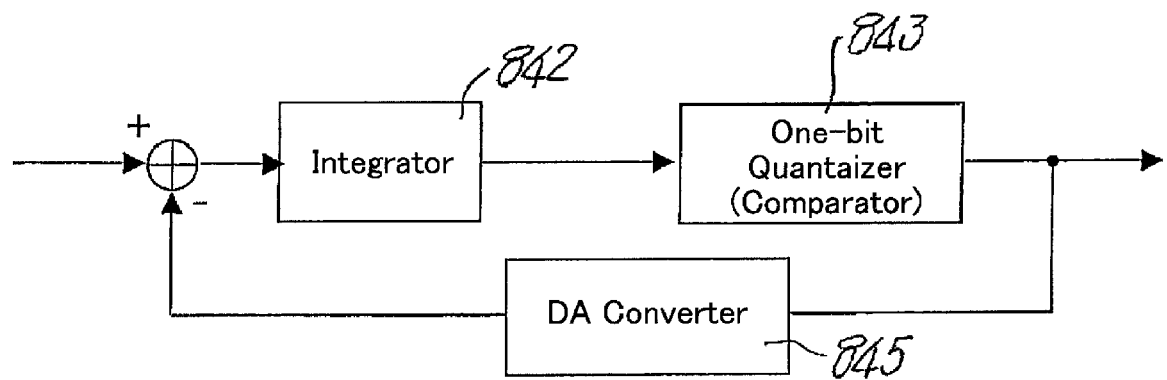
FIG. 5 is a block diagram illustrating an exemplary ΔΣ modulator applicable to the conventional digital microphone.

For a structure of a digital microphone according to the present invention, a structure specific to condenser microphones can be utilized without modifying it. That is, a condenser microphone comprises a condenser constituted by a membrane and an opposed electrode opposite to the membrane, and this condenser can be utilized as a part of a resonator in the present invention. An embodiment having this structure is shown in FIG. 3. Referring to FIG. 3, a membrane 40 and an opposed electrode 42 are disposed opposite each other with a space therebetween in the condenser microphone unit, and the membrane 40 is connected to a microphone case and is grounded. The opposed electrode 42 is disposed on a back plate 46 via an insulator 44. One end of an inductor 50 is connected to the opposed electrode 42, and the other end of the inductor 50 is connected to the earth. The condenser formed between the membrane 40 and the opposed electrode 42, and the inductor 50 constitute a resonator. The opposed electrode 42 is connected to a one-bit quantizer 18 through a negative resistance circuit 48. The embodiments shown in FIGS. 1 and 3 are identical to each other in terms of comprising the one-bit quantizer 18, the register 20 and the exclusive OR circuit 22, and the connection among them.

When the membrane 40 vibrates by receiving a sound wave, the capacitance of the condenser formed between the membrane 40 and the opposed electrode 42 is changed, which causes a change in the resonance frequency of the resonator constituted by the condenser and the inductor 50. The resonator constitutes a part of an oscillator, and the oscillator outputs an FM signal according to the vibration of the membrane 40 and the change in the resonance frequency through the negative resistance circuit 48. This output FM signal is input to the one-bit quantizer 18. The one-bit quantizer 18, the register 20, and the exclusive OR circuit 22 in the embodiment shown in FIG. 3 function in the same manner as those in the embodiment shown in FIG. 1, and a ΔΣ modulated signal is output from the exclusive OR circuit 22. A post-processing circuit for the ΔΣ modulated signal can be configured similarly to those in the first and second embodiments.

According to the above-described third embodiment, an acoustic signal can be directly converted into a ΔΣ modulated signal that is a digital signal, by utilizing the structure of a condenser microphone unit without modification added to the structure. A multi-bit digital signal can be obtained by sending the thus obtained ΔΣ modulated signal through a digital filter or the like.

Since analog circuits such as an amplifier circuit, a buffer circuit, and a differential circuit are not required, noises can be reduced by an amount corresponding to noises which otherwise would be generated at the analog circuits. Thus it is possible to provide a digital microphone with low noise and wide dynamic range.

What is claimed is:
1. A digital microphone, comprising:
a ΔΣ modulator, wherein
the ΔΣ modulator has
a resonator including a membrane which vibrates by receiving a sound wave, and a wiring pattern disposed opposite to the membrane,
an oscillator, including the resonator, for outputting an FM signal according to the vibration of the membrane, and
a one-bit quantizer for outputting a one-bit quantized signal by sampling the FM signal with a high-frequency clock.

2. The digital microphone according to claim 1, wherein the membrane and the wiring pattern serve as electrodes of a condenser, and the capacitance of the condenser is changed by the vibration of the membrane so that the resonance frequency of the resonator is changed.

3. The digital microphone according to claim 1, wherein the wiring pattern serves as an inductor, and the inductance of the inductor is changed by the vibration of the membrane so that the resonance frequency of the resonator is changed.

4. A digital microphone comprising:
a ΔΣ modulator, wherein
the ΔΣ modulator has
  a condenser constituted by a membrane which vibrates by receiving a sound wave, and an opposed electrode disposed opposite to the membrane,
  a resonator constituted by the condenser and an inductor connected to the condenser,
  an oscillator, including the resonator, for outputting an FM signal according to the vibration of the membrane, and
  a one-bit quantizer for outputting a one-bit quantized signal by sampling the FM signal with a high-frequency clock.

5. The digital microphone according to claim 1 or 2, further comprising an edge detector for detecting an edge of the one-bit quantized signal output from the one-bit quantizer.

6. The digital microphone according to claim 1 or 2, wherein an edge detector includes an exclusive OR circuit.

7. A digital microphone, comprising:
a ΔΣ modulator, wherein
the ΔΣ modulator has
  a resonator including a membrane which vibrates by receiving a sound wave, and a wiring pattern disposed opposite to the membrane,
  a delay circuit for providing a different delay time according to an opposed position to the membrane,
  an oscillator, including the resonator, for outputting an FM signal according to the vibration of the membrane, and outputting a plurality of FM signals through the delay circuit, and
  a plurality of edge detectors for detecting edges of the respective FM signals; wherein
the digital microphone outputs a plurality of parallel ΔΣ modulated signals.

8. The digital microphone according to claim 7, wherein the membrane and the wiring pattern serve as electrodes of a condenser, and the capacitance of the condenser is changed by the vibration of the membrane so that the resonance frequency of the resonator is changed.

9. The digital microphone according to claim 7, wherein the wiring pattern serves as an inductor, and the inductance of the inductor is changed by the vibration of the membrane so that the resonance frequency of the resonator is changed.

* * * * *